United States Patent

Schoffel

[19]

[11] Patent Number: 5,872,821
[45] Date of Patent: Feb. 16, 1999

[54] ARRANGEMENT FOR GENERATING DIGITAL SIGNALS

[75] Inventor: Peter Schoffel, Kirchrüsselbach, Germany

[73] Assignee: U.S. Philips Corporation, New York, N.Y.

[21] Appl. No.: 749,427

[22] Filed: Nov. 15, 1996

Related U.S. Application Data

[63] Continuation of Ser. No. 380,926, Jan. 31, 1995, abandoned, which is a continuation of Ser. No. 184,899, Jan. 21, 1994, abandoned, which is a continuation of Ser. No. 846,655, Mar. 5, 1992, abandoned.

[30] Foreign Application Priority Data

Mar. 11, 1991 [DE] Germany ............ 41 07 729.6

[51] Int. Cl.⁶ ............ H04L 7/00; H04L 25/36
[52] U.S. Cl. ............ 375/371; 375/372; 375/373
[58] Field of Search ............ 375/371, 372, 375/373, 219, 356; 364/251.3, 259.2, 269; 395/550, 400; 327/141, 160

[56] References Cited

U.S. PATENT DOCUMENTS

| | | | |
|---|---|---|---|
| 3,883,853 | 5/1975 | O'Brien et al. ............ | 395/400 |
| 4,135,059 | 1/1979 | Schmidt ............ | 370/95.3 |
| 4,641,269 | 2/1987 | Japenga et al. ............ | 364/473 |
| 5,109,393 | 4/1992 | Saegusa ............ | 375/7 |

FOREIGN PATENT DOCUMENTS

| | | |
|---|---|---|
| 0408439A1 | 7/1990 | European Pat. Off. . |
| 126338 | 5/1988 | Japan . |
| 3417816A1 | 11/1985 | United Kingdom . |

*Primary Examiner*—Tesfaldet Bocure
*Attorney, Agent, or Firm*—Arthur G. Schaier

[57] ABSTRACT

Recurring digital control signals are provided in a predeterminable time frame, with a high time-dependent resolution and flexibility. Data for the control signals are stored in a write/read memory addressed by an address counter. A comparator is clocked with a multiple of the digital signals bit clock, for comparison with the content of a time Table stored in the write/read memory. For convenience in synchronizing to the time frames of adjacent cells in a cellular network, an offset adder may add the complement of a measured offset (delay) to the comparator clock signal, so that it is not necessary to adjust the values stored in the time Table.

20 Claims, 4 Drawing Sheets

ARRANGEMENT FOR GENERATING DIGITAL SIGNALS

This is a continuation of application Ser. No. 08/380,926, filed Jan. 31, 1995, ABN. Which is a continuation of application Ser. No. 08/184,899, filed Jan. 21, 1994 ABN, which is a continuation of application Ser. No. 07/846,655 filed Mar. 5, 1992 ABN.

BACKGROUND OF THE INVENTION

The invention relates to an arrangement for generating digital signals for a transmission system, more specifically control signals recurring, in essence, in a predeterminable time frame.

Such an arrangement is necessary, for example, in transmitters and receivers (radio sets) for the present Pan-European mobile radio system. In this mobile radio system speech signals are transmitted in digitized form together with other digital signals in a time-division multiple access method (TDMA). This requires a precise time timing control of various functions. A multiplicity of control signals is necessary for this purpose, which signals generally exhibit a periodic variation, i.e. are cyclically recurrent in a predeterminable time frame. In addition, these timing control signals should also be individually controllable in dependence on a large number of different operating requirements. The timing control signals may be derived from the signal of a central clock generator designated as a timer. This clock generator is in essence based on a counter which triggers an interrupt function of the processor of the radio set when a predetermined value is reached or exceeded and/or directly affects external control signals. If a large number of timing control signals are generated in this manner with a rather high time-dependent resolution, the processor is loaded very heavily. Another possibility consists of generating the timing control signals by means of specific switch mechanisms. The timing control signals are then predetermined, so that considerable restrictions arise with respect to the flexibility when these switch mechanisms are used, for example, when individual control signals are changed.

SUMMARY OF THE INVENTION

It is an object of the invention to provide an arrangement of the type mentioned in the opening paragraph which makes it possible to generate in a simple manner a multiplicity of digital signals representing respective information items in a plurality of categories, which have a high time-dependent resolution and flexibility when used.

This object is achieved with an arrangement of the type mentioned in the opening paragraph, in that the arrangement for generating the digital signals comprises a write/read memory provided for storing digital signals whose values are dependent on the time at which the digital signals, and an addressing are selected arrangement allocated to the write/read memory for selecting the digital signals.

The storage capacity of the write/read memory then determines the number as well as the complexity of the digital signals (=timing control signals). An addressing arrangement, for example, an address counter selects the control signals, i.e. a specific state of all the control signals, which address counter identifies this state with the aid of an address assigned in the write/read memory. The process of timing control signal generation for communication at any instant of time; thus only asks for the activation i.e. the selection of the stored individual timing control signals, corresponding to that instant of time so that the loading of the allocated processor is minimized. Furthermore, the simple indication of each address by individual simple control signals provides a complete freedom of choice of the order of the timing control signals. In addition, by simply overwriting control signals stored so far, the write/read memory makes it possible to feed new signal variations of a control signal.

A high time-dependent resolution of the digital signals is provided in that the arrangement for generating digital signals comprises a comparator provided for comparing the content of a comparative counter specifically clocked with a multiple of a clock of the digital signals (that is, a multiple of the transmission bit rate) with the content of a time Table containing a plurality of timing control signals data that can be stored in the write/read memory. If the comparative counter operates as a so-called quarter bit counter, for example, with four times the bit clock of the timing control signals, there is a timing control signal resolution into quarter bits. The time Table of the write/read memory may then list for each timing control signal all the time frame start instants (simple control signal) possible with this resolution. A certain state of the timing control signals is thus not selected until both the address of the address counter matches the predetermined address and the start instant information contained in the time Table matches the predetermined start instant.

In a radio transceiver operating according to a time-division multiple access method, a synchronization of the digital signals may be effected in that the arrangement for generating the digital timing control signals comprises synchronizing means provided for synchronizing the time frame of the digital signals with a predeterminable time frame and/or for synchronizing a predeterminable time interval of a first time frame with a further time frame asynchronous thereto, while the reference to the first time frame is maintained. If, for example, during the operation of a mobile radio telephone the signal delay of the timing control signals is changed, the control signals (=digital signals) may again be synchronized with the predeterminable time frame, specifically the received time frame with the aid of the synchronizing means. This is effected, for example, by inserting or omitting an additional clock count of the comparative counter. With a cellular structure of a mobile radio system such insertion or omission makes it possible to switch to and from between the time frames of various, for example, adjacent radio cells, when the synchronizing means effect a synchronization of a first time frame with a further time frame asynchronous thereto for a predeterminable time interval, while the reference to the first time frame is maintained.

If the write/read memory is subdivided into at least two separately selectable areas, there is a possibility of switching very rapidly between various types of operation i.e. between various timing control signal records. In addition, a part of the write/read memory which is unused at a particular instant may be used by the processor without any problems with respect to time.

If at least one interrupt signal is stored in the write/read memory, an interruption may be predetermined with the aid of the interrupt signal for example once per time frame in accordance with a desired requirement. This makes it also possible to switch to a different operating mode by means of other timing control signals stored in a second area of the write/read memory.

If the arrangement is realised as an integrated semiconductor circuit, especially in mobile radio telephones this provides the possibility of integrating in a space-saving manner the whole arrangement for generating the most diverse timing control signals in a housing which has small outside dimensions. If the arrangement is realised as an integrated peripheral function on a microprocessor, for example, a microprocessor already available in a radio transceiver may at the same time incorporate the whole control signal generating arrangement.

A simple presentation of digital signals, especially for a mobile radio system operating according to a time-division multiple access method, is made possible in that the digital signals are available for controlling a radio transceiver of a radio transmission system.

If the digital transmission system is a mobile radio system and the arrangement in a mobile and/or base station of the digital mobile radio system are integrated, the given requirements, for example, for the Pan-European mobile radio system may, be satisfied with an arrangement of this type.

The invention will be further explained in the following with reference to the exemplary embodiments represented in the drawing Figures.

BRIEF DESCRIPTION OF THE DRAWINGS

FIG. 2 shows the variations of various control signals to be read when a counter and Table T value match as shown in FIG. 2a;

DESCRIPTION OF THE PREFERRED EMBODIMENT

Figure 1:
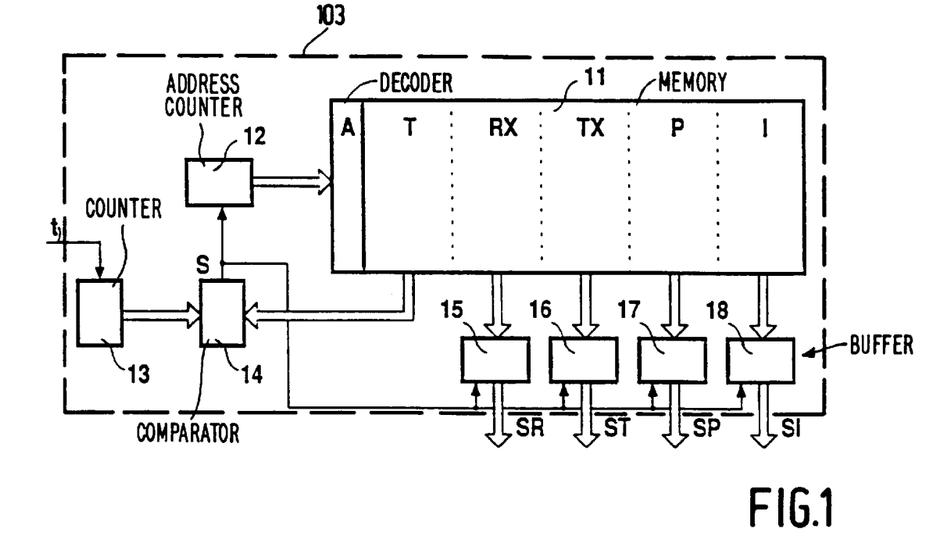
FIG. 1 shows a simplified block diagram of an arrangement for generating control signals.

The block diagram represented in FIG. 1 shows an exemplary embodiment for an arrangement for generating digital signals. These digital signals may be, for example, timing control signals for the various functions (e.g. transmitter, receiver) of a digital radio transmission system, which are recurrent in time frames which frames comprise a plurality of time slots. This is the manner of operation of, for example, radio sets operated according to the time-division multiple access method (TDMA), and are necessary, for example, for the future Pan-European mobile radio system GSM (Groupe Speciale Mobile). A precise time control of a plurality of functions is then required. This is effected with a plurality of timing control signals which generally exhibit a periodic behaviour, but for which it is also necessary to influence them individually depending on a large number of different requirements. For this purpose, the timing control signals in the exemplary embodiment shown in FIG. 1 are stored in a write/read memory 11. The write/read memory 11 is subdivided into a time Table T, for timing data, and different categories of data items including signal Tables RX, TX, a pulse Table P as well as an interrupt Table I. The content of the time Table T that is, a timing is compared to the content of a comparative counter 13 by means of a comparator 14. Because the purpose is to provide precise time control with respect to a predetermined time frame of the communications system, an initial value of the comparative counter 13 will be, typically, synchronized to the start of one of those predetermined time frames. The comparative counter 13 is clocked with a clock t corresponding to a multiple of the clock of the timing control signals. In the event of matching values the appropriate timing control signal is selected from the signal Tables RX, TX over a simple control line S by way of an address counter 12 and an address decoder A included in the memory counter 11. In addition, the simple control line S is connected to buffers 15, 16, 17, 18. By way of these buffers 15 to 18 the information signals read from the signal Tables RX, TX, from the pulse Table P and from the interrupt Table I are presented as timing control signals SR, ST, SP and SI.

The central element of the exemplary embodiment represented in FIG. 1 of an arrangement for regenerating time-dependent functions is formed by the write/read memory 11. Each line of the write/read memory 11 is subdivided into five areas and has a specific control signal code in the information signals. The information on this line, including the start instant in Table T, thus forms one record accessible via the address of the line. In the area of the time Table T each line of the memory stores the exact start instant of the control timing signals accommodated on the same line in the areas of the signal Tables RX, TX. For example, if the clock t of the comparative counter 13 is four times the bit clock of the timing control signals, four start instants are possible for each timing control signal during each bit period of the predetermined time frame. The area of the signal Table RX accommodates, for example, all the timing control signals relating to the receiver, and the area of the signal Table TX accommodates the timing control signals relating to the transmitter. The area of the pulse Table P accommodates information signals for triggering synchronizing signals, which synchronizing signals generate a pulse in each output line for example for synchronization of the control signals. Furthermore, a synchronization of the time frame of the timing control signals with the received time frame may be effected by means of the pulse Table P. A further possibility consists of the fact that a synchronization may temporarily be effected between the time frame of the timing control signals and a further time frame asynchronous relative to the predetermined time frame, without the reference to the predetermined time frame being lost. The content of the interrupt Table I may be transported by way of the buffer 18 to, for example, an interrupt generator (not shown in FIG. 1).

Figure 2A:
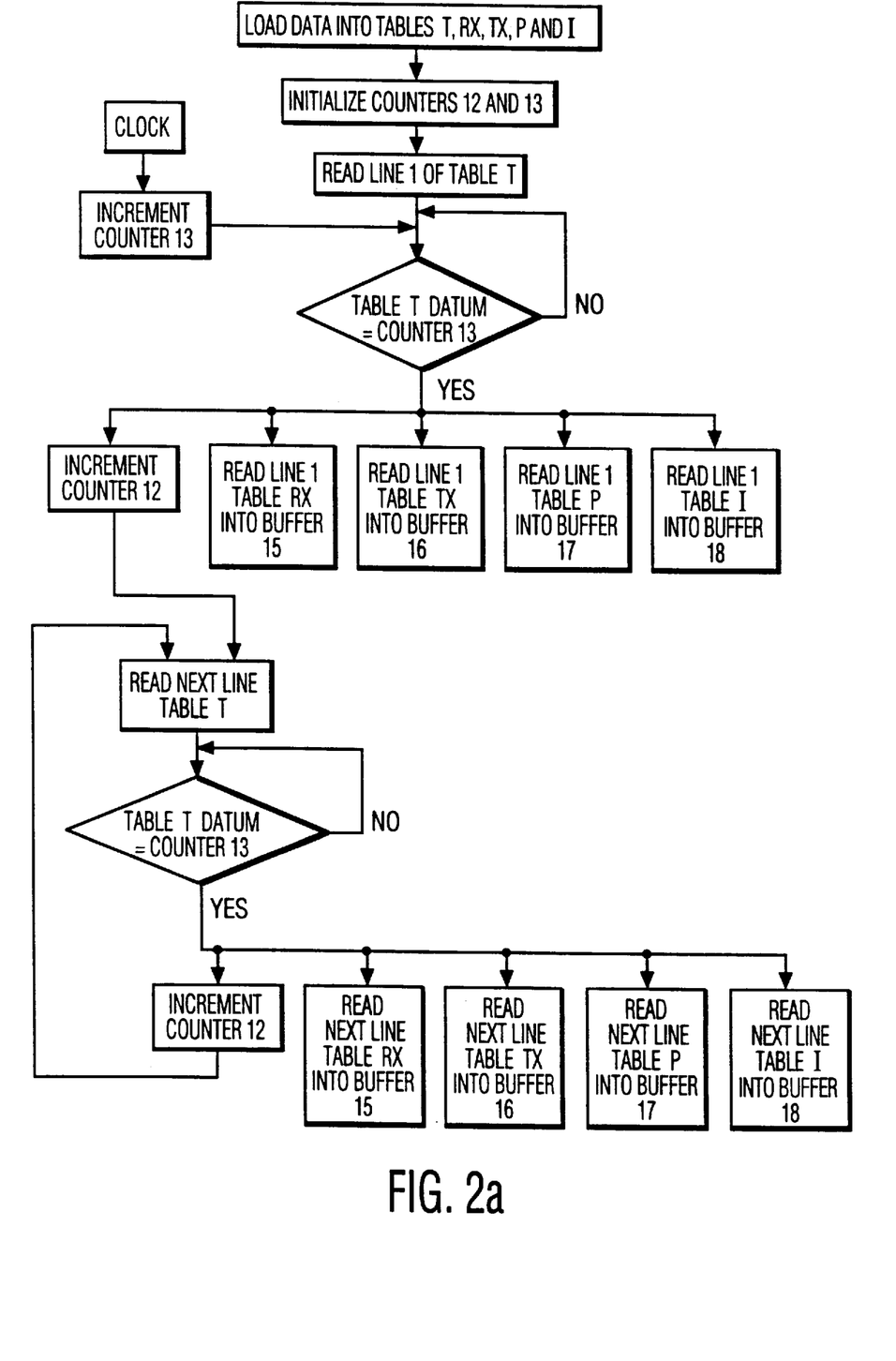
FIG. 2a is a timing flow chart showing operation of the arrangement of FIG. 1.
Figure 4:
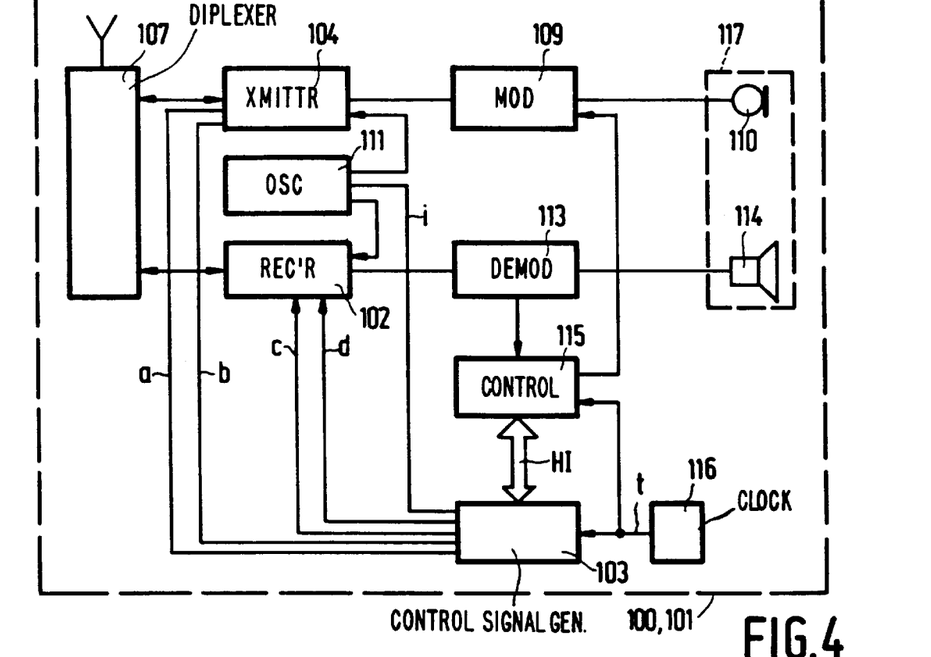
FIG. 4 shows a radio transceiver.

The operation of the arrangement represented in FIG. 1 is thus in essence effected in the following steps. In accordance with the well-known techniques for organizing and accessing memory locations in data base systems and programming, the various timing control signals for controlling functions of the transceiver, such as that shown in FIG. 4, are written in Table RX and Table TX. The individual timing control signals are determined in accordance with specifications for the particular communication system or protocol under which the transceiver is to be operated. Each of these control signals has values corresponding to various times (time slots), which are the columns of the table of FIG. 2b. Similarly, values of the pulse Table P and interrupt Table I are determined and recorded. These values for each specific time slot or fractional time slot are recorded as one record, accessible via a line address which is the time slot value recorded in Table T, and the method used with that memory for accessing different fields of a record. The counter 12 will also be initialized at a number corresponding to the address of the first line in Table T. As shown in FIG. 2a the content, for example, of the first line of the time Table T is compared with the content of the comparative counter 13 by means of the comparator 14. The comparative counter 13 is clocked, for example, with four times the time frame clock and continuously incremented with this clock. The period of the comparative counter thus exactly corresponds to a time frame. If the comparator 14 detects equality between the content of the comparative counter 13 and the content of the time Table T, the following operations are executed.

The contents of the signal Tables RX, TX are loaded in the buffers 15, 16, and presented as timing control signals SR, ST at the outputs. The information signals contained in the pulse Table are loaded in the buffer 17 and transported as a control signal SP, for example, to an arrangement (not shown in FIG. 1) which generates a pulse on each output line. For example, a pulse is only generated when the appropriate content is a logic "1", otherwise no reaction will follow. The pulse length is then, for example, ⅛ bit. The content of the interrupt Table I is transported, for example, to an interrupt generator (not shown in FIG. 1), which activates, for example, an interrupt line to a host processor. Once this procedure has been terminated, the comparative counter 13 is incremented. This causes a new time value to appear in the comparator 14. When the comparative counter has reached this time value, the above-described procedures are rerun.

The structure represented in FIG. 1 makes it thus possible for said values having a quarter bit resolution at random instants in the predetermined time frame to switch one or various timing control signals on or off, generate one or more different pulses or generate an interrupt. These functions may also be combined at random. For this purpose it is only necessary that the "results", that is, the information stored in the write/read memory be stored in a sorted manner in the order in which they occur, that is, according to increasing values of the time Table T. The arrangement represented in FIG. 1 thus enables the generation of a random number of timing control signals with a high time-dependent resolution and flexibility of the generated timing control signals while at the same time the loading of the host processor is minimized. A still more flexible operation of the arrangement shown in FIG. 1 may be achieved in that the write/read memory 11 and the associated time Table T, the signal Tables RX, TX as well as the pulse and interrupt Tables P and I respectively, are subdivided into a plurality of independent sections. Each section of the write/read memory 11 is then activated by means of an information signal that can be given to the address counter 12 by the host processor. As a result, it is possible to switch the arrangement very rapidly between two different types of operation having optionally different timing control signals in response to one simple information signal. In addition, a just unused Table section may be used without time problems by the host processor.

FIG. 2 shows an embodiment for control signals a to i to be generated. Minimum requirements for realising such control signals are that, on the one hand, the necessary control signals are generated largely independently while the utilization of the host processor is minimized, and on the other hand, a high degree of flexibility, for example in respect of the start instant of the control signals, is to be guaranteed for making adaptations possible to different set configurations of a mobile radio system. Such a flexibility ensures the applicability in later generations of sets, or makes the use of such an arrangement structured as an integrated semiconductor circuit possible also in sets made by other manufacturers.

The signal variations a to i shown in FIG. 2 are recurrent in a time frame subdivided into eight time slots 0 to 7. The signals a to f are, for example, the timing control signals stored in the signal Tables RX, TX of the arrangement shown in FIG. 1, whereas the signals g to i, for example, represent synchronizing or interrupt signals respectively stored in the pulse Table P or interrupt Table I respectively (FIG. 1). The double-pointed arrow A at the beginning of the first time window of the time frame symbolizes that the total time frame can be synchronized with the received time frame by means of the arrangement shown in FIG. 1. The arrow denoted B symbolizes the possibility of correcting once per time frame deviations caused by signal delays. This is effected, for example, by omitting or inserting an additional clock pulse at the request of the host processor. This swallow-insert function shortens or lengthens the time frame by a quarter bit. The subsequent time frames are shifted accordingly.

Figure 2B:
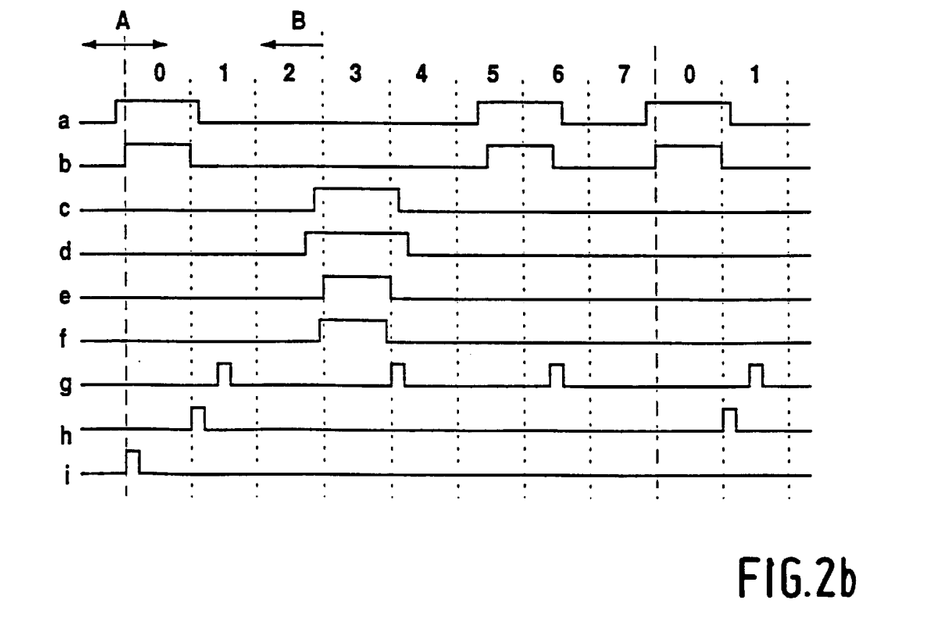

In an arrangement provided for the future Pan-European mobile radio system (GSM=Groupe Speciale Mobile), the signals represented in FIG. 2b carry out, for example, the following tasks:

Preparation of signals for controlling the time-division multiple access method;

Controlling the signal processor for the baseband processing;

Controlling the software of a digital signal processor; and

Taking over all the hardware control and monitoring tasks.

Figure 3:
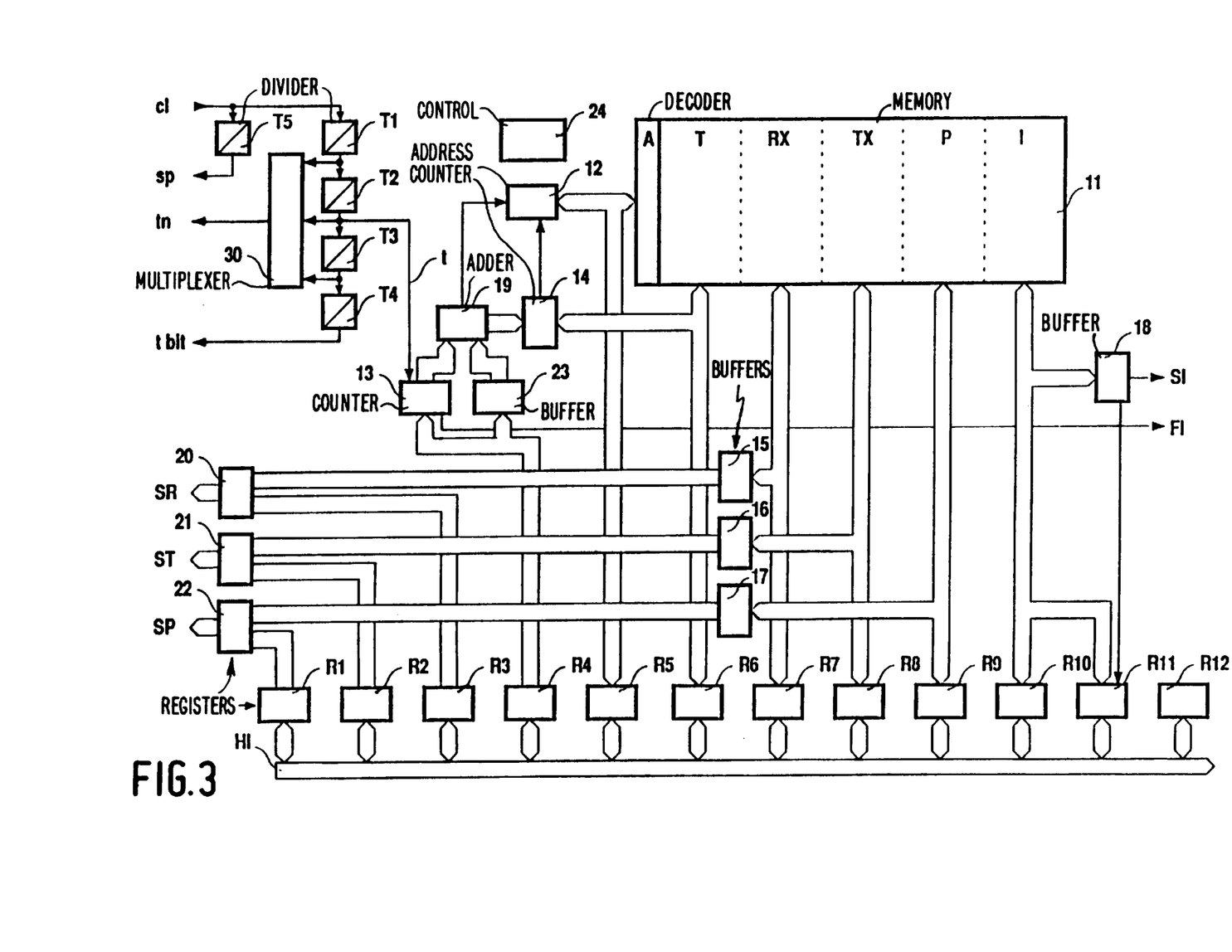
FIG. 3 shows a block diagram of an arrangement for generating control signals.

FIG. 3 shows a detailed block diagram of an arrangement for generating timing and other control signals. Like reference numerals are used for the blocks already represented in connection with FIG. 1. The central element is here again the write/read memory 11 which is subdivided into the time Table T, the signal Tables RX, TX as well as the pulse Table P and the interrupt Table I. All the clock signals necessary in the arrangement shown in FIG. 3 are derived from an input clock cl. For example, for digitizing the audio signal, a clock sp is derived with the aid of a clock divider T5. submultiples of the input clock cl may be derived by means of clock dividers T1, T2, T3. These multiples of the input clock are applied to a multiplexer 30 from whose output a desired bit clock tn may be tapped. A further clock divider T4 is arranged in series with the clock dividers T1, T2, T3 and produces a bit clock tbit. As already observed with respect to FIG. 1, the comparative counter 13 is clocked with a clock t which is a multiple of the clock tbit of the control signals. In addition to the exemplary embodiment shown in FIG. 1, an offset adder 19 is inserted between the comparative counter 13 and the comparator 14 in the arrangement shown in FIG. 3. The arrangement may be connected to the host processor over a data bus HI by way of 12 registers R1 to R12. The control signals SR, ST, SP are presented by way of output registers 20, 21, 22.

The offset adder 19 makes a shift of the time frame relative to the time frame of an adjacent cell in a mobile radio transmission system possible. A processor (host interface) connected by way of a control bus HI then computes the offset relative to the so-called serving station (serving cell). This offset may be caused by delays. The offset adder 19 adds the complement of the thus determined offset to the content of the comparative counter 13 via a buffer 23. The result of this addition forms the input signal for the comparator 14. A further operation is necessary to deal with the offset, because the address counter 12 generally indicates an erroneous Table entry in the time Table T after the value in the offset buffer 23 has changed. For this reason it is necessary to correct the address counter 12, because otherwise in the worst case a whole time frame may be lost as a result of the change of the offset. For this purpose, the address counter 12 is reset after each change of the content of the offset register R4. The address counter 12 is incremented as long as the Table entries belonging to the content of the address counter 12 in the time Table T are smaller than the value at the output of the offset adder 19. The contents of the sections RX, TX, P, I of the write/read memory 11 are then ignored, that is, the outputs remain unchanged and no synchronizing pulses or interrupts are produced. As a result, the address counter 12 points at the first Table entry of the time Table T that exceeds the instantaneous count of the sum of the content of the comparative counter 13 and the offset. This method ensures that the address counter 12 is corrected in the fastest way possible and the output states directly change from the old to the new state. By way of a signal FI (Frame Interrupt) consisting, for example, of a pulse ⅛ bit in length, once the offset register R4 has been loaded, the beginning of the first time frame may be marked by a correct setting of the comparative counter 13.

The processor gains access to twelve registers (R1 to R12) over the connection HI arranged as a data bus. For example, the synchronization or the selection of the desired bit clock is verified by way of the control register R12. The register R5 is the address register for accessing the time Table. This register may identify which line of the time Table T is written or read out by means of a write/read access to a register (R6 to R10).

The registers R6 to R10 form temporary registers for writing/reading the individual sections of the time Table T. As already observed, the register R4 forms the time offset register. The registers R1 to R3 form the mask register. For example, a "0" recorded in this register may keep the corresponding signal line at "0". The register R11 forms the interrupt vector register. A control function 24 coordinates all the operations in the arrangement shown in FIG. 3. The control signals SR, ST, SP are finally supplied by way of the output registers 20, 21, 22 respectively.

FIG. 4 shows a diagrammatic structure of a radio transceiver 100, 101 comprising an arrangement 103 for generating control signals a, b, c, d. The radio transceiver 100, 101 comprises a diplexer 107 which has an aerial. The diplexer 107 is connected to a transmitter 104 and a receiver 102. The transmitter 104 is connected to a microphone 110, for example of a handset 117, by way of a modulator 109. The handset 117 further includes a loudspeaker 114 which is connected to the receiver 102 by way of a demodulator 113. The transmitter 104 and the receiver 102 are driven by a frequency generator 111 to which a control signal i is applied. The radio transceiver 100, 101 additionally includes a control unit 115 connected to the modulator 109, to the demodulator 113 and also to the arrangement 103 for generating the control signals. Furthermore, a clock generator 116 is provided which applies a clock t to the control unit 115 and also to the arrangement 103 for generating the control signals. The arrangement 103 for generating the control signals and the control unit 115 are interconnected by way of a line HI.

The radio transceiver 100, 101 shown in FIG. 4 operates according to a time-division multiple access method (TDMA) and is to be used, for example, in the Pan-European mobile radio system GSM. This requires an exact time-dependent control of the operations of the transmitter 104 and the receiver 102 and of the frequency generator 111. This timing and other control is effected with the aid of control signals a..i, generated with the aid of the arrangement 103. The generation of the control signals a..i is explained with reference to the FIGS. 1 to 3.

Figure 5:
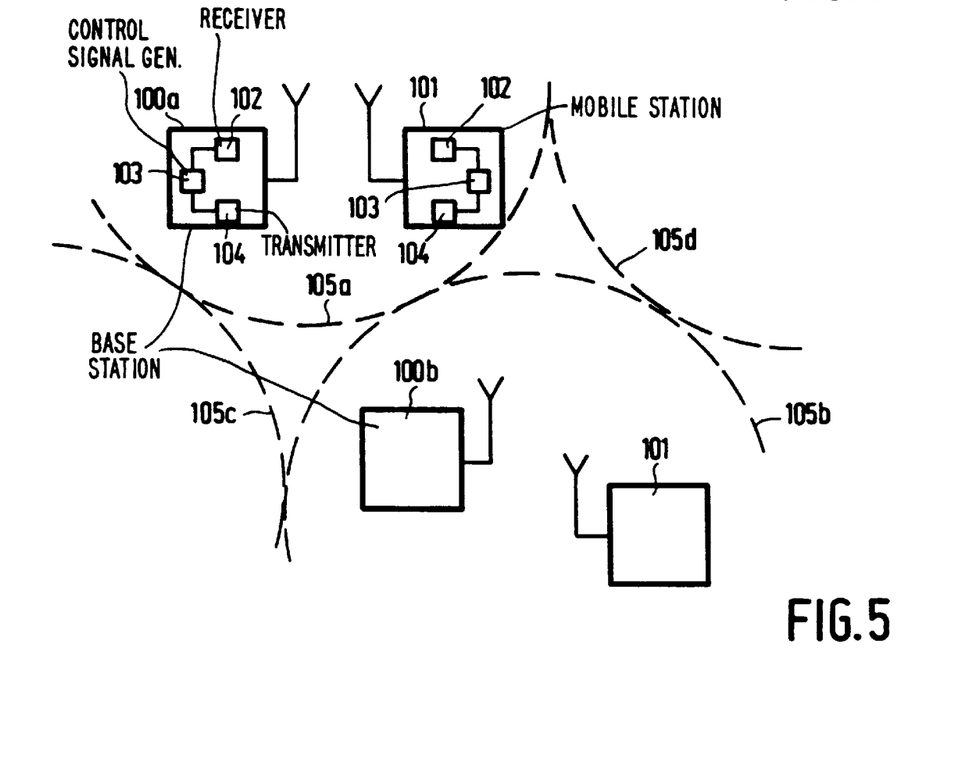
FIG. 5 shows a cellularly structured mobile radio system.

FIG. 5 shows a cellular arrangement of a mobile radio system. It comprises base stations 100a, 100b as well as mobile stations 101. The mobile stations 101 are, for example, mobile radio telephones in a private car, a train and so on, or structured as mobile handsets. The mobile radio system consists of separate radio cells 105a, 105b, 105c, 105d, while only the range boundaries are shown of radio cells 105c, 105d. Each base station 100a, 100b as well as each mobile station 101 comprises, for example, a transmitter arrangement 102 as well as a receiver arrangement 104. The transmitter arrangement 102 and receiver arrangement 104 make the transmission possible of radio signals between base station 100a, 100b and the mobile stations 101. For this purpose an aerial is allocated to each base station 100a, 100b and mobile station 101. In addition, each base station 100a, 100b and mobile station 101 comprises an arrangement for generating control signals 103.

In the mobile radio transmission system represented in FIG. 5, for example, the Pan-European mobile radio system GSM is discussed in which timing control signals are necessary which are recurrent in a time frame consisting of one or more time slots. The control signals control the various functions, more specifically, that of the transmitter arrangement 102 and the receiver arrangement 104. The control signals generated with the aid of the arrangement 103 in addition carry out the following tasks: preparation of signals for controlling the time-division multiple access method, controlling with time the processor for the baseband processing, and controlling the software of a digital host processor. The arrangement 103 comprises a write/read memory as has already been described with reference to the FIGS. 1 and 3, while the selection of the control signals is effected by means of the address arrangements allocated to the write/read memory. The arrangement 103 comprises a synchronizing means which, for a predeterminable time slot, makes a synchronization possible of a first time frame produced, for example, by the radio cell 105a, with another time frame asynchronous thereto which is produced, for example, by the radio cell 105b. During this operation the reference to the first time frame of the radio cell 105a is maintained, so that it is possible in the cellularly structured mobile radio system as shown in FIG. 5 to switch to and from between the time frames of adjacent radio cells 105a and 105b.

I claim:

1. A circuit for generating repetitively transmitted signals recurring in a predeterminable time frame, comprising:

a write/read memory for storing a plurality of timing data, and a plurality of data items, each timing datum having at least a respective one of said data items corresponding thereto, a counter, means for clocking said counter, means for comparing the content of said counter with a timing datum which is one of said timing data and is read from said memory, and providing a read signal, and addressing means, responsive to said read signal, for reading from said memory the corresponding at least a respective one of said data items.

2. A circuit as claimed in claim 1, wherein said timing data are times in a first time frame, characterized in that said circuit comprises synchronizing means for synchronizing said means for clocking to signal transmission times in said first time frame, and, in a second time frame asynchronous to said first time frame, for synchronizing said means for clocking to corresponding times in said second time frame.

3. A circuit as claimed in claim 2, characterized in that said synchronizing means also maintains a reference to said first time frame.

4. A circuit as claimed in claim 1, characterized in that said plurality of data items includes a respective plurality of category data items in each of a plurality of categories, at least one timing datum has a respective category data item corresponding thereto in each of a plurality of said categories, corresponding category datum items being read simultaneously when a read signal is provided responsive to comparison with said at least one timing datum.

5. A circuit as claimed in claim 1, characterized in that
said timing signals are stored in a time table in said memory, and
said memory includes an area for storing said data items, said area being divided into at least two separately selectable sub-areas.

6. A circuit as claimed in claim 5, characterized in that at least one interrupt signal is stored in one of said sub-areas.

7. A circuit as claimed in claim 1, characterized in that one of said data items is an interrupt signal.

8. A circuit for generating repetitively transmitted signals representing data items, and recurring in a predeterminable time frame, for transmission at a transmission bit rate, comprising:
a write/read memory for storing a plurality of timing data, and a plurality of said data items, each timing datum having at least a respective one of said data items corresponding thereto,
a counter,
means for clocking said counter at a rate which is a multiple of said transmission bit rate,
means for comparing the content of said counter with a timing datum which is one of said timing data and is read from said memory, and providing a read signal, and
addressing means, responsive to said read signal, for reading from said memory the corresponding at least a respective one of said data items.

9. A circuit as claimed in claim 8 wherein said timing data are times in a first time frame, characterized in that said circuit comprises synchronizing means for synchronizing said means for clocking to signal transmission times in said first time frame, and, in a second time frame asynchronous to said first time frame, for synchronizing said means for clocking to corresponding times in said second time frame.

10. A circuit as claimed in claim 9, characterized in that said synchronizing means also maintains a reference to said first time frame.

11. A circuit as claimed in claim 10, characterized in that said plurality of data items includes a respective plurality of category data items in each of a plurality of categories, at least one timing datum has a respective category data item corresponding thereto in each of a plurality of said categories, corresponding category datum items being read simultaneously when a read signal is provided responsive to comparison with said at least one timing datum.

12. A circuit as claimed in claim 11, characterized in that
said timing signals are stored in a time table in said memory, and
said memory includes an area for storing said category data items, said area being divided into at least two separately selectable sub-areas.

13. A circuit as claimed in claim 8, characterized in that at least one interrupt signal is stored in one of said sub-areas.

14. A radio transceiver for use in a cellular radio transmission system, including a circuit for generating control signals recurring in a predeterminable time frame, comprising:
a write/read memory for storing a plurality of timing data, and a plurality of control signals, each timing datum having at least a respective one of said control signals corresponding thereto, and
means for selecting and reading from said memory the corresponding at least a respective one of said control signals at a respective time related to each respective stored timing datum, wherein said means for selecting and reading comprises:
a counter,
means for clocking said counter,
means for comparing the content of said counter with a timing datum which is one of said timing data and is read from said memory, and providing a read signal, and
addressing means, responsive to said read signal, for reading from said memory the corresponding at least a respective one of said control signals.

15. A radio transceiver for use in a cellular radio transmission system, including a circuit for generating control signals recurring in a predeterminable time frame, comprising:
a write/read memory for storing a plurality of timing data, and a plurality of control signals, each timing datum having at least a respective one of said control signals corresponding thereto, and
means for selecting and reading from said memory the corresponding at least a respective one of said control signals at a respective time related to each respective stored timing datum, wherein
said control signals are generated at a clock rate, and
said means for selecting and reading comprises a counter, means for clocking said counter at a higher rate which is a multiple of said clock rate, a comparator for comparing the content of said counter with at least one of said timing data and providing a read signal, and an addressing means responsive to the read signal for reading from said memory at least a respective one of said control signals.

16. A transceiver as claimed in claim 15, wherein said respective times are times in a first time frame, characterized in that said circuit comprises means for synchronizing said means for clocking to said times in said first time frame, and for synchronizing said means for clocking to corresponding times in a second time frame asynchronous to said first time frame while maintaining reference to said first time frame.

17. A transceiver as claimed in claim 15, characterized in that said plurality of control signals includes a respective plurality of category control signals in each of a plurality of categories, at least one timing datum has a respective category control signal corresponding thereto in each of a plurality of said categories, corresponding category control signals being read simultaneously when a read signal is provided responsive to comparison with said at least one timing datum.

18. A transceiver as claimed in claim 17, characterized in that
said timing signals are stored in a time table in said memory, and said memory includes an area for storing said category control signals, said area being divided into at least two separately selectable sub-areas.

19. A transceiver as claimed in claim 18, characterized in that at least one interrupt signal is stored in one of said sub-areas.

20. A transceiver as claimed in claim 15, characterized in that said transmission system operates according to a time-division multiple access method.

* * * * *